US012757327B2

(12) United States Patent
Yu et al.

(10) Patent No.: US 12,757,327 B2
(45) Date of Patent: Oct. 6, 2026

(54) BURIED SKIP VIAS FOR IMPROVED SIGNAL AND POWER INTEGRITY

(71) Applicant: NVIDIA Corporation, Santa Clara, CA (US)

(72) Inventors: Mingyi Yu, Saratoga, CA (US); Gregory Patrick Bodi, Santa Cruz, CA (US); Gabriele Gorla, Santa Clara, CA (US); Xiang Sun, Los Gatos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 269 days.

(21) Appl. No.: 18/197,146

(22) Filed: May 15, 2023

(65) Prior Publication Data

US 2024/0389230 A1 Nov. 21, 2024

(51) Int. Cl.

*H05K 1/11* (2006.01)
*H05K 3/46* (2006.01)
*H05K 1/02* (2006.01)

(52) U.S. Cl.

CPC ........... *H05K 1/115* (2013.01); *H05K 3/4644* (2013.01); *H05K 1/0251* (2013.01); *H05K 2201/09509* (2013.01); *H05K 2201/09536* (2013.01); *H05K 2201/096* (2013.01); *H05K 2203/1476* (2013.01)

(58) Field of Classification Search

CPC .... H05K 1/115; H05K 1/0251; H05K 1/0298; H05K 2201/09509; H05K 2201/09536; H05K 2201/096; H05K 2201/095; H05K 1/116

See application file for complete search history.

(56) References Cited

U.S. PATENT DOCUMENTS

2006/0289202 A1* 12/2006 Takeuchi .......... H01L 23/49827 174/262
2007/0271783 A1* 11/2007 Ikeda .................. H05K 3/4641 257/E23.079
2008/0083560 A1* 4/2008 Saiki ................ H01L 23/49827 174/255
2009/0236143 A1* 9/2009 Nakamura ............ H05K 1/115 174/261
2012/0103664 A1* 5/2012 Frosch ................ H05K 1/0298 174/251
2015/0257281 A1* 9/2015 Kao .................... H05K 3/4611 174/262
2019/0378801 A1* 12/2019 Leitgeb ................. H01Q 1/526
2023/0319978 A1* 10/2023 Smith ................. H05K 1/0253 174/262

* cited by examiner

*Primary Examiner* — Roshn K Varghese
(74) *Attorney, Agent, or Firm* — Lowenstein Sandler LLP

(57) ABSTRACT

A printed circuit board (PCB) includes an exterior section having a first set of layers including an outermost conductive layer. The PB further includes an interior section, adjacent to the exterior section, having a second set of layers including a first conductive layer corresponding to a first end of the interior section, a second conductive layer corresponding to a second end of the interior section opposite the first end, and a third conductive layer disposed between the first conductive layer and the second conductive layer. The exterior section further includes a set of vias extending from an outermost conductive layer to the first conductive layer. The interior section further includes a buried skip via extending from the first conductive layer to the third conductive layer.

12 Claims, 13 Drawing Sheets

500B

BURIED SKIP VIAS FOR IMPROVED SIGNAL AND POWER INTEGRITY

TECHNICAL FIELD

At least one embodiment pertains to printed circuit board (PCB) fabrication. For example, at least one embodiment pertains to technology for implementing buried skip vias for improved signal and power integrity.

BACKGROUND

A printed circuit board (PCB) can be used to connect electronic components. A PCB can include multiple conductive layers. The conductive layers can include at least a top layer and a bottom layer. The conductive layers can further include one or more layers disposed between the top layer and the bottom layer. In such PCBs, the top layer and the bottom layer can be referred to as "exterior layers" and each additional layer can be referred to as an "interior layer." A PCB can include one or more vias that enable respective interconnections between the conductive layers. More particularly, a via can be formed by forming a hole that traverses through at least two adjacent conductive layers, and plating the hole with a conductive material that forms an electrical connection.

BRIEF DESCRIPTION OF DRAWINGS

Various embodiments in accordance with the present disclosure will be described with reference to the drawings, in which.

DETAILED DESCRIPTION

Figure 1A:
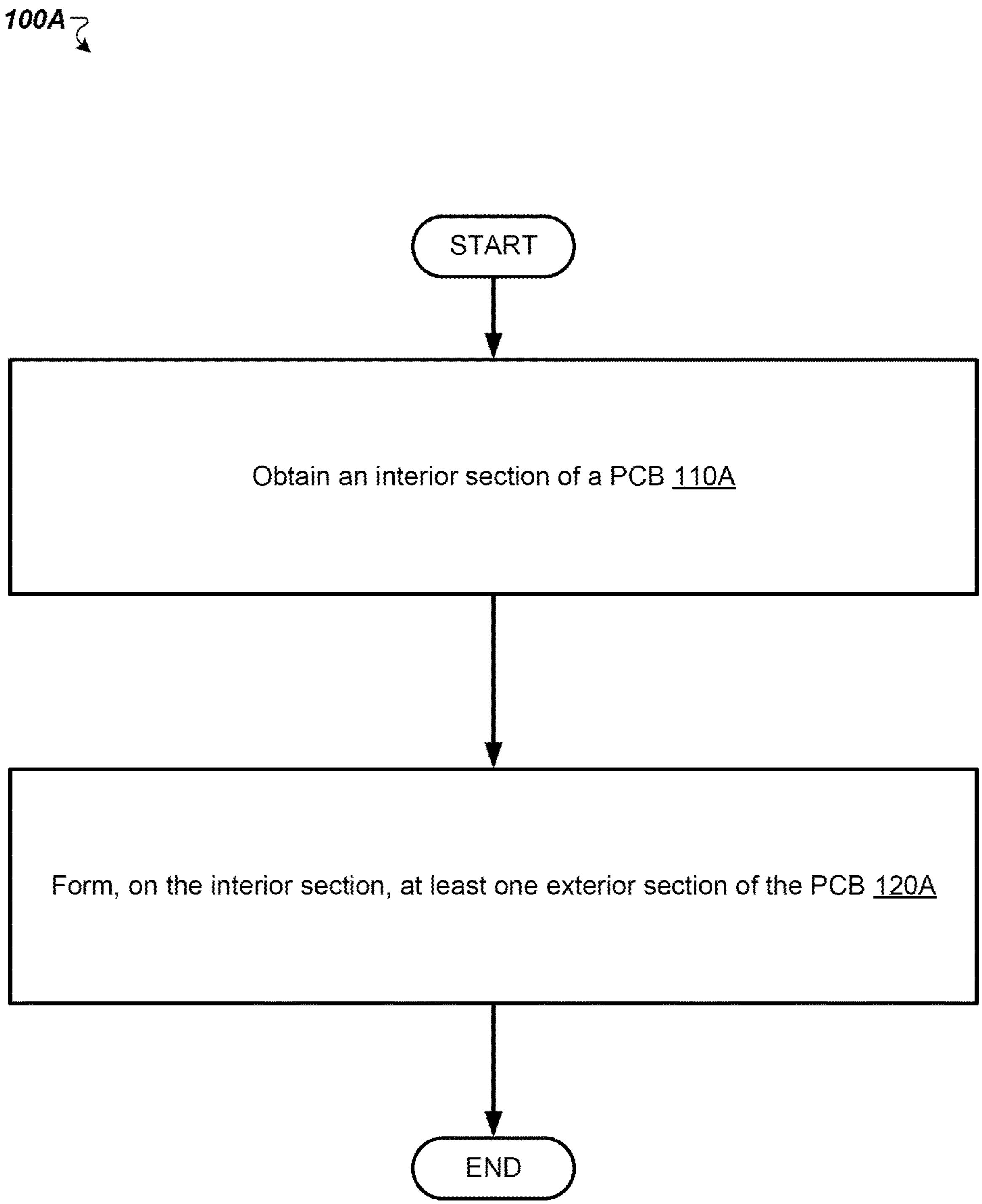
FIGS. 1A-1B are flow diagrams of example methods to fabricate electronic devices including printed circuit board (PCBs), in accordance with at least some embodiments.

A PCB can include at least one plated through-hole (PTH). A PTH refers to a hole that extends between exterior layers of a PCB (i.e., the top layer of the PCB and the bottom layer of the PCB). A PCB can further include at least one via.

One example of a via is a blind via. A blind via refers to a via that connects an exterior layer of a PCB (e.g., the top layer or the bottom layer) to one or more interiors layer of the PCB. Accordingly, blind vias are only visible from one side of the PCB. Another example of a via is a buried via. A buried via refers to a via formed between two interior layers of a PCB. Accordingly, a buried via is not visible from either side of the PCB.

To improve signal and power integrity, a PCB can include at least one set of staggered vias. A set of staggered vias can include at least two vias formed on at least two different layers at an offset from an initial layer to a final layer. Each via of the set of staggered vias can be connected by a conductive material (e.g., a conductive or metal layer of the PCB). That is, the vias of a set of staggered vias may include holes formed at respective lateral locations of a conductive layer of the PCB.

A set of staggered vias can include any combination of blind vias and/or buried vias. For example, a set of staggered vias can include a blind via having a hole formed between the initial layer (i.e., an exterior layer) and an intermediate interior layer at a first lateral position, and a buried via having a hole formed from the intermediate interior layer at a second lateral position offset from the first lateral position to a final layer (i.e., another interior layer deeper in the PCB). As another example, a set of staggered vias can include a first buried via having a hole formed between the initial layer (i.e., an interior layer) and an intermediate interior layer at a first lateral position, and a second buried via having a hole formed from the intermediate interior layer at a second lateral position offset from the first lateral position to the final layer (i.e., an interior layer).

Additionally or alternatively, to improve signal and power integrity, a PCB can include at least one set of stacked vias. A set of stacked vias can include at least two vias stacked on top of each other. More specifically, a first via of a set of stacked vias can be drilled and plated before a second via of the set of stacked vias is formed on the first via. Each via of the set of stacked vias can be connected by a conductive material. That is, the vias of a set of stacked vias include holes formed at the substantially same lateral location. The conductive material used to form a first via of the set of stacked vias may directly contact the conductive material used to form a second via of the set of stacked vias.

A set of stacked vias can include any combination of blind vias and/or buried vias. For example, a set of stacked vias can include a blind via having a hole formed between the initial layer (i.e., an exterior layer) and an intermediate interior layer at a lateral position, and a buried via having a hole formed from the intermediate interior layer at the lateral position (e.g., directly beneath the blind via) to the final layer (i.e., an interior layer). As another example, a set of stacked vias can include a first buried via having a hole formed between the initial layer (i.e., an interior layer) and an intermediate interior layer at a lateral position, and a second buried via having a hole formed from the intermediate interior layer at the lateral position (e.g., directly beneath the first buried via) to the final layer (i.e., an interior layer).

Some PCBs can be formed using high density interconnect (HDI) technology. HDI technology can enable a denser PCB design in which more electronics components can be included in a particular area (i.e., reduce the size of a PCB). HDI-based PCBs can include at least one plated through-hole (PTH) via or at least one baseband processor (BB) via. HDI-based PCBs can further include one or more vias. In some implementations, the one or more vias include one or more microvias. A microvia refers to a via hole that has a depth-to-diameter aspect ratio of less than or equal to about 1:1. Due to their size, microvias can be used for high-speed implementations due to a lower parasitic capacitance. Microvias can be formed using any suitable techniques. For example, microvias can be formed by laser drilling via holes, and plating the holes with conductive material (e.g., electroplating).

A PCB can include a stack of layers. The stack of layers can include a pair of exterior sections. The pair of exterior sections can include a top section including a first set of layers and a bottom section including a second set of layers. More specifically, the first set of top layers includes the top layer of the PCB and the second set of layers includes the bottom layer of the PCB. The layers of the top section and the layers of the bottom section are sequentially laminated and connected with a respective set of vias (e.g., microvias). In some embodiments, the set of vias of the top section form a first set of stacked vias and the set of vias of the bottom section form a second set of stacked vias. The PCB can further include an interior section disposed between the pair of exterior sections. The interior section can include a set of interior layers. The set of interior layers can include an initial interior layer (e.g., a topmost interior layer that contacts the first set of top layers and a final interior layer (e.g., a bottommost interior layer that contacts the second set of bottom layers). The set of interior layers can further include at least one intermediate interior layer disposed between the initial interior layer and the final interior layer.

A PCB can include a stack design with a total number of layers. The exterior and interior sections can include any suitable number of layers of the stack. The number of layers of the exterior and interior sections can be defined using "i+N+i" notation, where i represents the number of layers of each exterior section and N represents the number of layers of the interior section. Thus, a PCB can be formed with an i+N+i stack design. Embodiments described herein can enable a 1-N-1 stack design, a 2-N-2 stack design, a 3-N-3 stack design, a 4-N-4 stack design, etc.

A PCB can be fabricated using a number of lamination cycles, where the number of lamination cycles can depend at least in part on the stack design of the PCB. For example, a PCB can be formed with a 5-8-5 stack design in which the first and second exterior sections include 5 conductive layers and the interior section includes 8 conductive layers. The PCB can include a stack of 6 vias extending through the first exterior section and a stack of 6 vias extending through the second exterior section. The PCB can further include a BB via formed within the interior section extending through the 8 conductive layers. Such a 5-8-5 stack design can employ six lamination cycles to form the exterior sections with a pre-constructed interior section. It may be beneficial to reduce the number of lamination cycles used to fabricate a PCB in order to increase fabrication efficiency and reduce costs.

Aspects of the present disclosure can address the deficiencies above and other challenges by implementing buried skip vias for improved signal and power integrity. A PCB described herein can be an HDI-based PCB. The PCB can include a stack of layers. The stack of layers can include a pair of exterior sections. The pair of exterior sections can include a top section including a first set of layers and a bottom section including a set second of layers. More specifically, the first set of top layers includes the top layer of the PCB and the second set of layers includes the bottom layer of the PCB. The layers of the top section and the layers of the bottom section can be sequentially laminated on a pre-manufactured interior section of the PCB and connected with a respective set of vias (e.g., microvias). In some embodiments, the set of vias of the top section form a first set of stacked vias and the set of vias of the bottom section form a second set of stacked vias.

The PCB can include an interior section disposed between the pair of exterior sections. The interior section can include a set of interior layers. The set of interior layers can include an initial (e.g., topmost) interior layer and a final (e.g., bottommost) interior layer. The set of interior layers can further include at least one intermediate interior layer disposed between the initial interior layer and the final interior layer. A BB via can be formed from the initial interior layer to the final interior layer of the set of interior layers. A first buried skip via can be formed from the initial interior layer to a first intermediate interior layer and a second buried skip via can be formed from the final interior layer to a second intermediate interior layer. The first buried skip via and the second buried skip via refer to buried vias that bypass or "skip" at least one layer. For example, at least one layer can be located between the initial interior layer and the first intermediate interior layer, and at least one layer can be located between the final interior layer and the second intermediate interior layer. In some embodiments, the at least one layer is a single layer (i.e., the first and second buried skip vias bypass a single layer). Alternatively, the at least one layer includes multiple layers. The buried skip vias can be used for power connections and/or signal network connections in some embodiments. In some embodiments, the PCB is used to enable a high-speed interface for a computer module. A third layer of the stack and a fifth layer of the stack can be used for high-speed routing in some embodiments. The third layer of the stack can use the second layer of the stack and the fourth layer of the stack as a dual ground reference plane, and the fifth layer of the stack can use the fourth layer of the stack and the sixth layer of the stack as a dual ground reference plane in some embodiments. The first buried skip via can be used to connect the fourth layer to the sixth layer.

A PCB described herein can include a stack design with a total number of layers (e.g., an i+N+i stack design). For example, a PCB described herein can be formed having a 1-N-1 stack design, a 2-N-2 stack design, a 3-N-3 stack design, a 4-N-4 stack design, etc.

The use of buried skip vias can reduce the number of lamination cycles employed to fabricate the PCB. Moreover, the use of buried skip vias can improve signal and power integrity of the PCB. For example, a PCB described herein can include 18 total layers and have a 3-12-3 stack design, in which each exterior section includes 3 conductive layers, and the interior section includes 12 conductive layers. In this example, the set of vias of the top section can include 3 vias formed from the upper surface of the first layer of the stack to the upper surface of the fourth layer of the stack (where each via is between two adjoining layers), and the set of vias of the bottom section can include 3 vias formed from the bottom surface of the eighteenth layer of the stack to the bottom surface of the fifteenth layer of the stack. The BB via can be formed from the upper surface of the fourth layer of the stack (e.g., the initial or topmost layer of the interior section) to the bottom surface of the fifteenth layer of the stack (e.g., the final or bottommost layer of the interior section). The first buried skip via can be formed from the upper surface of the fourth layer of the stack (e.g., the initial or topmost layer of the interior section) to the bottom surface of the sixth layer of the stack (e.g., two layers beneath the initial or topmost layer of the interior section), and the second buried via can be formed from the bottom layer of the fifteenth layer of the stack (e.g., the final or bottommost layer of the interior section) to the upper layer of the thirteenth layer of the stack (e.g., two layers above the final or bottommost layer of the interior section). A first additional via can be formed from an upper surface of the fourth layer of the stack (e.g., the initial or topmost layer of the interior section) to an upper surface of the fifth layer of the stack (e.g., one layer beneath the initial or topmost layer of the interior section), and a second additional via can be formed from a bottom surface of the fifteenth layer of the stack (e.g., the final or bottommost layer of the interior section) to a bottom surface of the fourteenth layer of the stack (e.g., one layer above the final or bottommost layer of the interior section). Such a 3-12-3 stack design can be achieved by performing four lamination cycles on a premanufactured interior section of a PCB having 12 interior layers, to result in a PCB having 18 total layers. In contrast, a PCB having 18 layers that achieves the same or similar electrical connections without the use of a buried skip via would start with a premanufactured interior section with 8 interior layers onto which 5 exterior layers would be formed on top and bottom of the premanufactured interior section. Such an 18 layer PCB would need to have six lamination cycles performed to fabricate the PCB having 18 total layers with similar connections between layers, e.g., a 5-8-5 stack design. Further details regarding implementing buried skip vias for improved signal and power integrity will be described below with reference to FIGS. 1-4.

Advantages of the present disclosure include, for example, reduced complexity by reducing the number of lamination cycles. Moreover, embodiments described herein can be used to achieve improved signal and power integrity as compared to traditional techniques for manufacturing electronic devices including PCBs.

FIG. 1A illustrates a flow diagram of a method 100A to fabricate electronic devices including PCBs, according to at least one example embodiment. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 110A, an interior section of a PCB is obtained. In some embodiments, the PCB is an HDI-based PCB. More specifically, the interior section can be formed from a first set of layers. The first set of layers can be a stack of alternating conductive layers and non-conductive layers. For example, the first set of layers can include a first conductive layer corresponding to a first end of the interior section and a second conductive layer corresponding to a second end of the interior section opposite the first end.

Each conductive layer can include any suitable electrically conductive material (e.g., metal). Examples of materials that can be used to form each conductive layer include copper (Cu), tungsten (W), cobalt (Co), molybdenum (Mo), ruthenium (Ru), etc. Non-conductive layers may be formed from a non-conductive (e.g., electrically insulating) material. Examples of non-conductive materials that may be used for the non-conductive layers include a composite plasticized phenol resin and paper material (e.g., FR-2), a composite material of woven fiberglass (e.g., FR-4), plastics, flexible plastics (e.g., for flexible circuit boards), and so on.

Each conductive layer of the first set of layers can have a respective index value. For example, if the first set of layers includes N conductive, then the first conductive layer of the first set of layers can have an index value of 1 and the second conductive layer of the first set of layers can have an index value of N. The first set of layers can include any suitable number of conductive layers. In some embodiments, the first set of layers includes 12 conductive layers (e.g., N=12). An example of an interior section having 12 conductive layers will be described in further detail below with reference to FIG. 4. In some embodiments, the first set of layers includes 10 conductive layers (e.g., N=10). An example of an interior section having 10 conductive layers will be described in further detail below with reference to FIG. 5.

The interior section can include a first set of vias formed within the first set of layers. The first set of vias can include at least one buried skip via. In some embodiments, the at least one buried skip via includes a first buried skip via extending from the first conductive layer of the first set of layers to a third conductive layer of the first set of layers. The third conductive layer of the first set of layers is disposed between the first conductive layer of the first set of layers and the second conductive layer of the first set of layers. In some embodiments, the first buried skip via bypasses a single conductive layer. For example, the first conductive layer of the first set of layers can have an index value of 1, the second conductive layer of the first set of layers can have an index value of N, and the third conductive layer of the first set of layers can have an index value of 2.

In some embodiments, the at least one buried skip via includes a second buried skip via extending from the second conductive layer of the first set of layers to a fourth conductive layer of the first set of layers. The fourth conductive layer of the first set of layers is disposed between the first conductive layer of the first set of layers and the second conductive layer of the first set of layers. The fourth conductive layer of the first set of layers can be any suitable conductive layer within the first set of layers. In some embodiments, the second buried skip via bypasses a single conductive layer of the first set of layers. For example, the first conductive layer of the first set of layers can have an index value of 1, the second conductive layer of the first set of layers can have an index value of N, and the fourth conductive layer of the first set of layers can have an index value of N-1.

In some embodiments, the interior section further includes an additional buried via extending from the first conductive layer of the first set of layers to the second conductive layer of the first set of layers. For example, the additional buried via can be a BB via. As another example, the additional buried via can be a PTH via.

In some embodiments, the interior section further includes at least one additional via. For example, the at least one additional via can include a first additional via extending from the first conductive layer of the first set of layers to a conductive layer adjacent to the first conductive layer of the first set of layers. A pair of conductive layers are referred to as "adjacent conductive layers" if their respective index numbers are consecutive. More specifically, if the first conductive layer of the first set of layers has an index value of 1, then the first additional via can have an index value of 2. As another example, the at least one additional via can include a second additional via extending from the second conductive layer of the first set of layers to a conductive layer adjacent to the second conductive layer of the first set of layers. More specifically, if the second conductive layer of the first set of layers has an index value of N, then the second additional via can have an index value of N-1. In some embodiments, the at least one additional via includes at least one microvia.

In some embodiments, obtaining the interior section includes forming the interior section. Further details regarding forming the interior section will be described below with reference to FIGS. 1B, 2, 4A-4B and 5A-5B.

At operation 120A, at least one exterior section of the PCB is formed on the interior section. The at least one exterior section can include first exterior section formed on a first end of the interior section. The first exterior section can include a second set of vias formed within a second set of layers. The second set of layers can be a stack of alternating conductive layers and non-conductive layers. More specifically, the second set of layers can include a first conductive layer corresponding to a first end of the first exterior section and a second conductive layer corresponding to a second end of the first exterior section opposite the first end. Each conductive layer of the second set of layers can have a respective index value. For example, if the second set of layers includes $M_1$ layers, then the first conductive layer of the second set of layers can have an index value of 1 and the second conductive layer of the second set of layers can have an index value of $M_1$. The second set of vias can extend from first conductive layer of the second set of layers (e.g., an outermost conductive layer of the PCB) to the first conductive layer of the first set of layers. In some embodiments, each via of the second set of vias is a microvia. In some embodiments, the second set of vias includes a set of stacked vias. For example, the second set of vias can be formed on the first additional via. In some embodiments, the second set of vias includes a set of staggered vias.

Each conductive layer can include any suitable electrically conductive material (e.g., metal). Examples of materials that can be used to form each conductive layer include copper (Cu), tungsten (W), cobalt (Co), molybdenum (Mo), ruthenium (Ru), etc. Non-conductive layers may be formed from a non-conductive (e.g., electrically insulating) material. Examples of non-conductive materials that may be used for the non-conductive layers include a composite plasticized phenol resin and paper material (e.g., FR-2), a composite material of woven fiberglass (e.g., FR-4), plastics, flexible plastics (e.g., for flexible circuit boards), and so on.

In some embodiments, the at least one exterior section further includes a second exterior section formed on a second end of the interior section. The second exterior section can include a third set of vias formed within a third set of layers. The third set of layers can be a stack of alternating conductive layers and non-conductive layers. More specifically, third set of layers can include a first conductive layer corresponding to a first end of the second exterior section and a second conductive layer corresponding to a second end of the second exterior section opposite the first end. Each conductive layer of the third set of layers can have a respective index value. For example, if the third set of layers includes $M_2$ layers, then the first conductive layer of the third set of layers can have an index value of 1 and the second conductive layer of the third set of layers can have an index value of $M_2$. The third set of vias can extend from the first conductive layer of the third set of layers (e.g., an outermost conductive layer of the PCB) to the second conductive layer of the third set of layers. In some embodiments, each via of the third set of vias is a microvia. In some embodiments, the third set of vias includes a set of stacked vias. For example, the third set of vias can be formed on the second additional via. In some embodiments, the third set of vias includes a set of staggered vias. In some embodiments, the second exterior section can be symmetric with respect to the first exterior section.

The second set of layers and/or the third set of layers can include any suitable number of layers. In some embodiments, the second set of layers includes the same number of conductive layers as the third set of layers. In some embodiments, at least one of the first exterior section or the second exterior section includes 3 conductive layers (e.g., at least one of $M_1$ or $M_2$ is equal to 3). In some embodiments, at least one of the first exterior section or the second exterior section includes 5 conductive layers (e.g., at least one of $M_1$ or $M_2$ is equal to 5).

Additional electronic device processing may be performed after forming the at least one exterior section. For example, fabricating an electronic device can further include electrically coupling one or more electric components to the PCB. Further details regarding operation 120A will be described below with reference to FIGS. 1B and 3. An example of a first exterior section and a second exterior section having 3 conductive layers will be described below with reference to FIGS. 4C-4F. An example of a first exterior section and a second exterior section having 5 conductive layers will be described in further detail below with reference to FIGS. 5C-5E.

Figure 2:
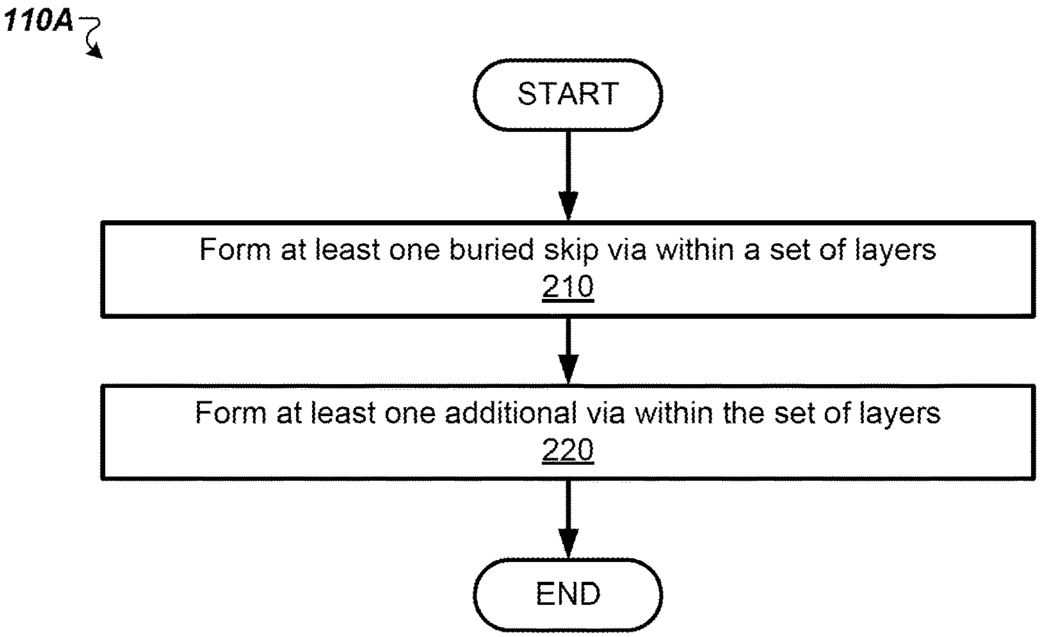
FIG. 2 is a flow diagram of an example method to fabricate interior sections of printed circuit boards (PCBs) of electronic devices, in accordance with at least some embodiments.

FIG. 2 illustrates a flow diagram of a method 110A to fabricate interior sections of PCBs of electronic devices, according to at least one example embodiment. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, at least one buried skip via is formed within a set of layers. More specifically, the set of layers can include a first conductive layer corresponding to a first end of an interior section of a PCB and a second conductive layer corresponding to a second end of the interior section opposite the first end. In some embodiments, the PCB is an HDI-based PCB. The set of layers can include alternating non-conductive layers and conductive layers. Each conductive layer of the set of layers can have a respective index value. For example, if the set of layers includes N conductive layers, then the first conductive layer can have an index value of 1 and the second conductive layer can have an index value of N.

In some embodiments, forming the at least one buried skip via includes forming a first buried skip via from the first conductive layer to a third conductive layer of the set of layers disposed between the first conductive layer and the second conductive layer. The third conductive layer can be any suitable conductive layer within the set of layers. In some embodiments, the first conductive layer has an index value of 1, the second conductive layer has an index value of N, and the third conductive layer has an index value of 2.

In some embodiments, forming the at least one buried skip via includes forming a second buried skip via from the second conductive layer to a fourth conductive layer of the set of layers disposed between the first conductive layer and the second conductive layer. The fourth conductive layer can be any suitable conductive layer within the set of layers. In some embodiments, the first conductive layer has an index value of 1, the second conductive layer has an index value of N, and the fourth conductive layer has an index value of N−1.

At operation 220, at least one additional via is formed within the set of layers. In some embodiments, forming the at least one additional via includes forming a first additional via the first conductive layer to the second conductive layer. For example, the first additional via can be a BB via. As another example, the first additional via can be a PTH via. In some embodiments, forming the at least one additional via includes forming a second additional via from the first conductive layer to a conductive layer adjacent to the first conductive layer. More specifically, if the first conductive layer has an index value of 1, then the adjacent conductive layer can have an index value of 2. In some embodiments, the second additional via is a microvia. In some embodiments, forming the at least one additional via includes forming a third additional via from the second conductive layer to a conductive layer adjacent to the second layer. More specifically, if the second conductive layer has an index value of N, then the adjacent conductive layer can have an index value of N−1. In some embodiments, the third additional via includes at is a microvia.

Figure 3:
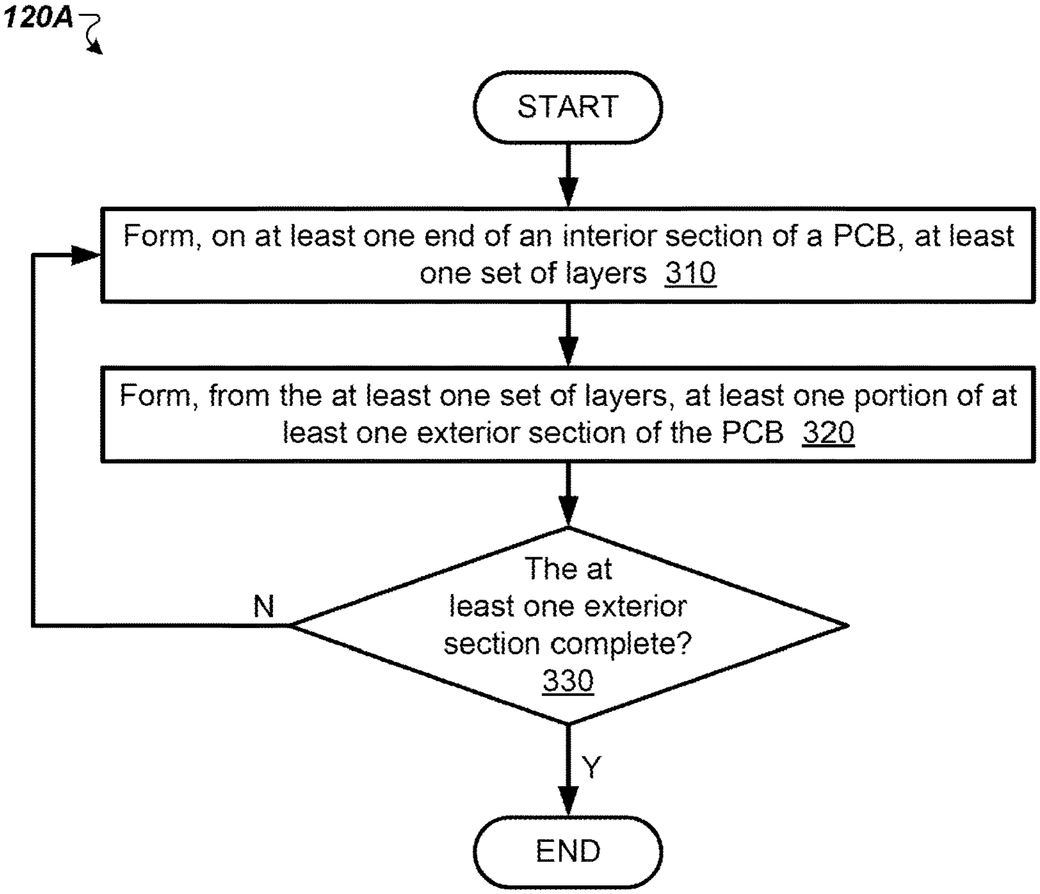
FIG. 3 is a flow diagram of an example method to fabricate exterior sections of printed circuit boards (PCBs), in accordance with at least some embodiments.

FIG. 3 illustrates a flow diagram of a method 120A to fabricate exterior sections of PCBs of electronic devices, according to at least one example embodiment. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, at least one set of layers is formed on at least one end of an interior section of a PCB. In some embodiments, the PCB is an HDI-based PCB. For example, the interior section of the PCB can be previously obtained (e.g., formed) as described above with reference to FIGS. 1A and 2. The at least one set of layers formed on the at least one end of the interior section of the PCB can include alternating non-conductive layers and conductive layers. In some embodiments, the at least one set of layers includes a pair of layers including a single non-conductive layer and a single conductive layer. For example, forming the at least one set of layers can include forming the single non-conductive layer on the end of the interior section of the PCB, and forming the single conductive layer on the single non-conductive layer.

In some embodiments, forming the at least one set of layers includes forming a first set of layers on a first end of the interior section of the PCB and forming a second set of layers on a second end of the interior section of the PCB opposite the first end. The first set of layers and the second set of layers can each include alternating non-conductive layers and conductive layers. In some embodiments, the first set of layers and the second set of layers each include a pair of layers including a single non-conductive layer and a single conductive layer. For example, forming the first set of layers can include forming a first non-conductive layer on the first end of the interior section of the PCB, and forming a first conductive layer on the first non-conductive layer. As another example, forming the second set of layers can include forming a second non-conductive layer on the second end of the interior section of the PCB, and forming a second conductive layer on the second non-conductive layer.

At operation 320, at least one portion of at least one exterior section of the PCB is formed from the at least one set of layers. Forming the at least one portion of the at least one exterior section of the PCB from the at least one set of layers can include forming at least one via in the at least one set of layers. In some embodiments, forming the at least one via in the at least one set of layers includes forming the at least one via from at least one outermost layer of the set of layers to the at least one end of the interior section of the PCB. For example, the at least one via can include at least one via formed in contact with at least one via of the interior section of the PCB. In some embodiments, the at least one via of the at least one portion of the at least one exterior section of the PCB is stacked on the at least one via of the interior section of the PCB. In some embodiments, the at least one via of the at least one portion of the at least one exterior section of the PCB is staggered with respect to the at least one via of the interior section of the PCB. In some embodiments, the at least one via of the at least one portion of the at least one exterior section of the PCB is via includes a microvia formed in contact with at least one microvia of the interior section of the PCB.

In some embodiments, forming the at least one portion of the at least one exterior section of the PCB from the at least one set of layers includes forming a first exterior section portion of a first exterior section of the PCB from the first set of layers, and forming a second exterior section portion of a second exterior section of the PCB from the second set of layers. Forming the first exterior section portion from the first set of layers can include forming at least one via in the first set of layers. In some embodiments, forming the at least one via in the first set of layers includes forming the at least one via in the first set of layers from an outermost layer of the first set of layers to the first end of the interior section of the PCB. Forming the second exterior section portion from the second set of layers can include forming at least one via in the second set of layers. In some embodiments, forming the at least one via in the second set of layers includes forming the at least one via in the second set of layers from an outermost layer of the second set of layers to the second end of the interior section of the PCB. In some embodiments, the first exterior section portion and the second exterior section portion are formed during the same lamination cycle. In some embodiments, the first exterior section portion and the second exterior section portion are symmetrically formed.

At operation 330, it is determined whether the at least one exterior section of the PCB is complete. If not, then the process reverts back to operation 310 to form at least one additional set of layers on the at least one end of the interior section of the PCB (i.e., directly on the at least one portion of the at least one exterior section of the PCB), and form at least one additional portion of the at least one exterior section of the PCB at operation 320. If the at least one exterior section is determined to be complete, then the process can end. In some embodiments, additional electronic device processing is performed after completing the at least one exterior section of the PCB. Further details regarding operations 310-330 are described above with reference to FIG. 1A and will be described below with reference to FIGS. 1B, 4A-4F, and 5A-5E.

Figure 1B:
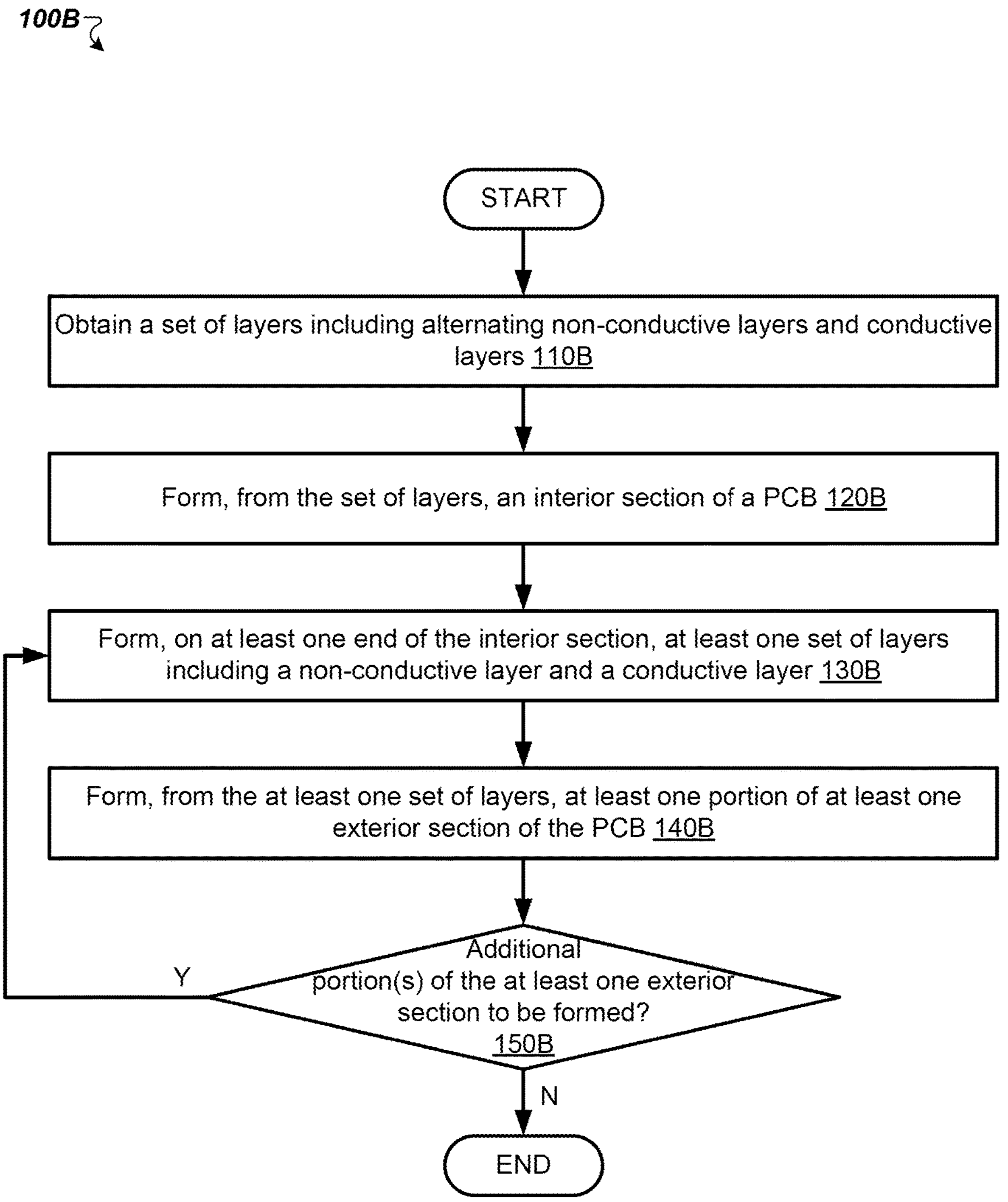

FIG. 1B illustrates a flow diagram of a method 100B to fabricate electronic devices including PCBs, according to at least one example embodiment. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 110B, a set of layers including alternating non-conductive layers and conductive layers is obtained and, at operation 120B, an interior section of a PCB including a set of vias is formed from the first set of layers. In some embodiments, the PCB is an HDI-based PCB. For example, the set of layers can include a first conductive layer corresponding to a first (e.g., top) end of the interior section and a second conductive layer corresponding to a second (e.g., bottom) end of the interior section opposite the first end. Each conductive layer of the first set of layers can have a respective index value. For example, if the set of layers includes N conductive layers, then the first conductive layer of the set of layers can have an index value of 1 and the second conductive layer of the set of layers can have an index value of N. The set of layers can include any suitable number of conductive layers. In some embodiments, the set of layers includes 12 conductive layers (e.g., N=12). An example of an interior section having 12 conductive layers will be described in further detail below with reference to FIGS. 4A-4F. In some embodiments, the first set of layers includes 10 conductive layers (e.g., N=10). An example of an interior section having 10 conductive layers will be described in further detail below with reference to FIGS. 5A-5E.

Each conductive layer can include any suitable electrically conductive material (e.g., metal). Examples of materials that can be used to form each conductive layer include copper (Cu), tungsten (W), cobalt (Co), molybdenum (Mo), ruthenium (Ru), etc. Non-conductive layers may be formed from a non-conductive (e.g., electrically insulating) material. Examples of non-conductive materials that may be used for the non-conductive layers include a composite plasticized phenol resin and paper material (e.g., FR-2), a composite material of woven fiberglass (e.g., FR-4), plastics, flexible plastics (e.g., for flexible circuit boards), and so on.

Figure 4A:
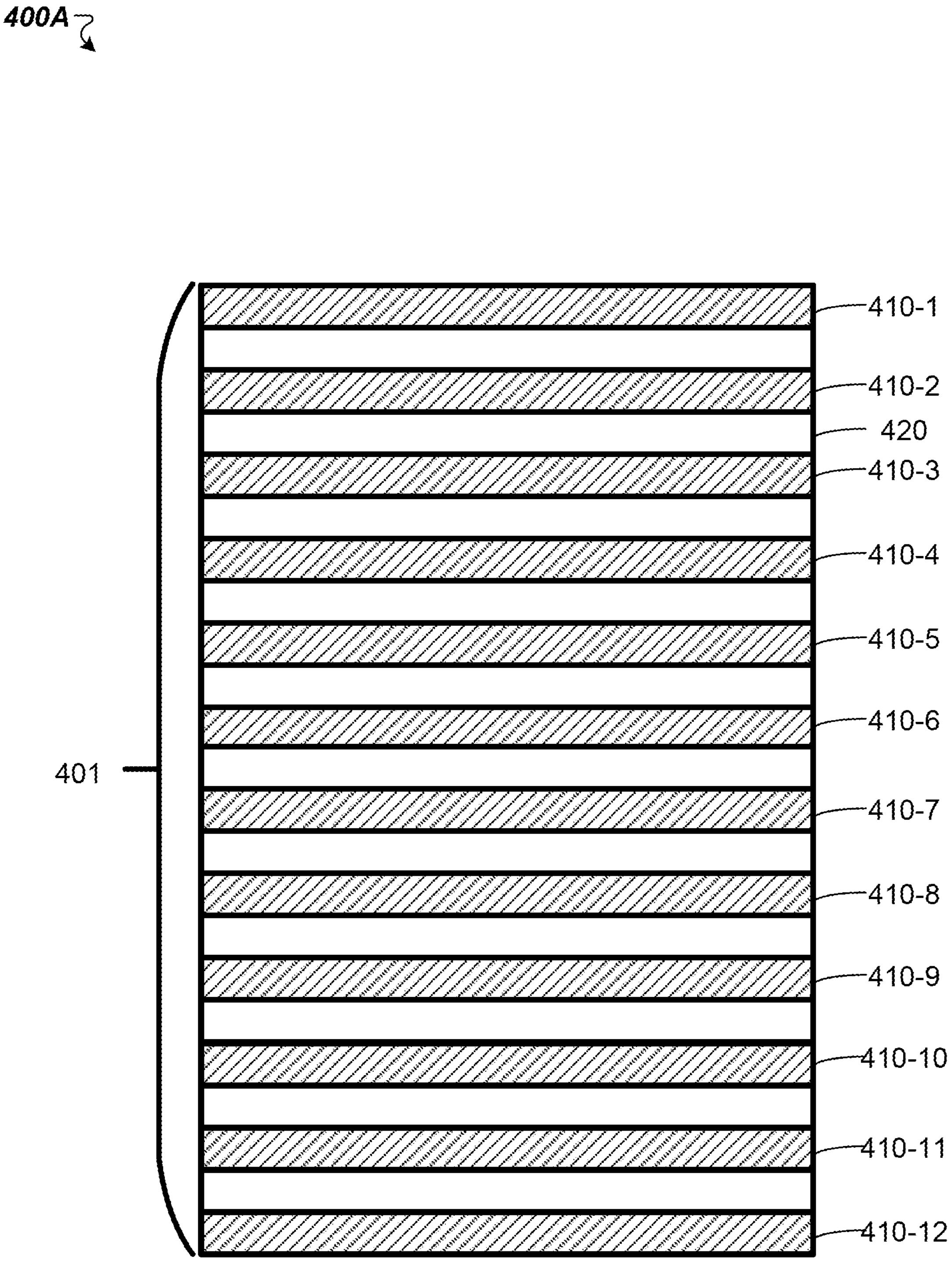
FIGS. 4A-4F are diagrams illustrating the fabrication of an example electronic device including a printed circuit board (PCB), in accordance with at least some embodiments.
Figure 4B:
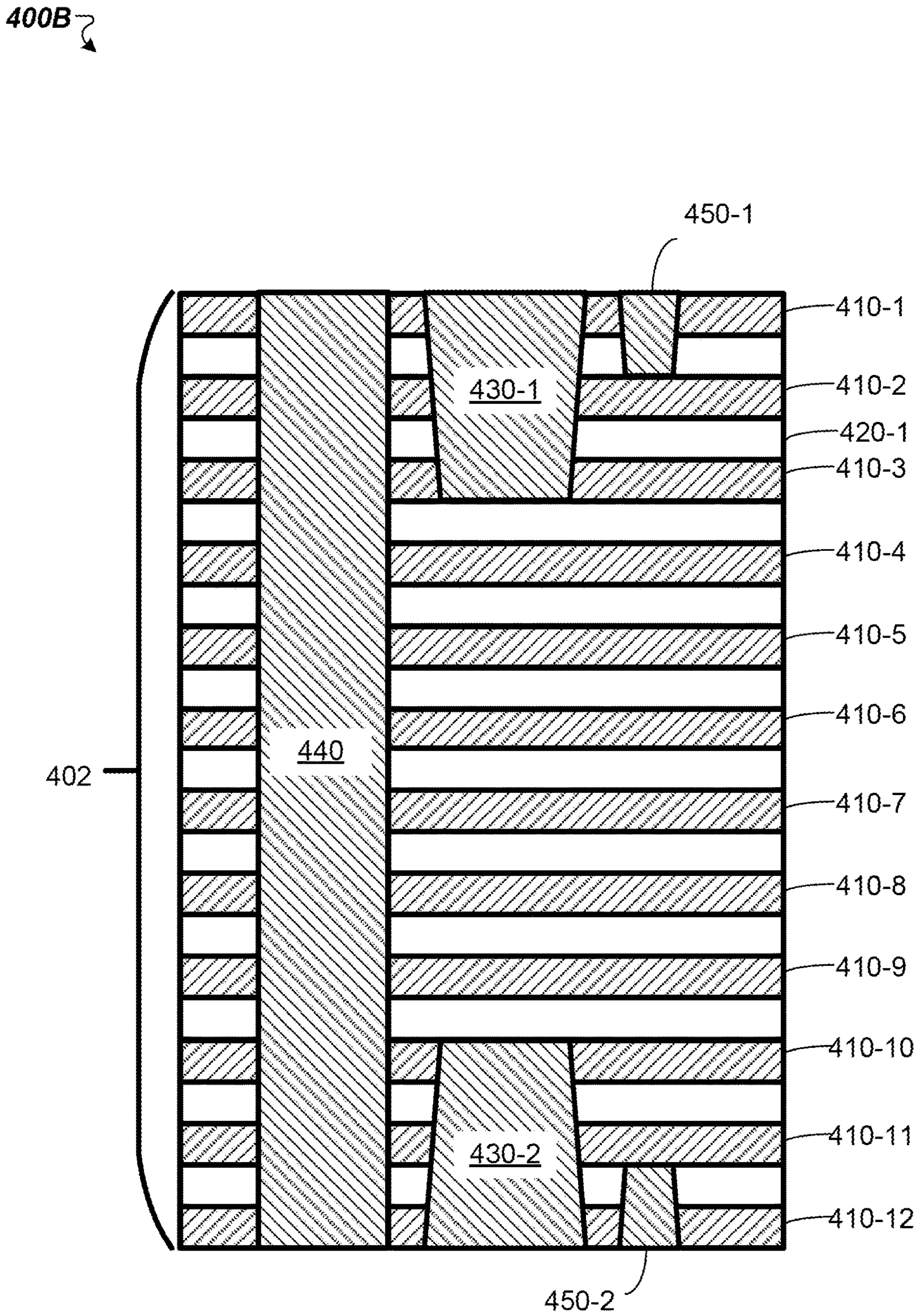
Figure 5A:
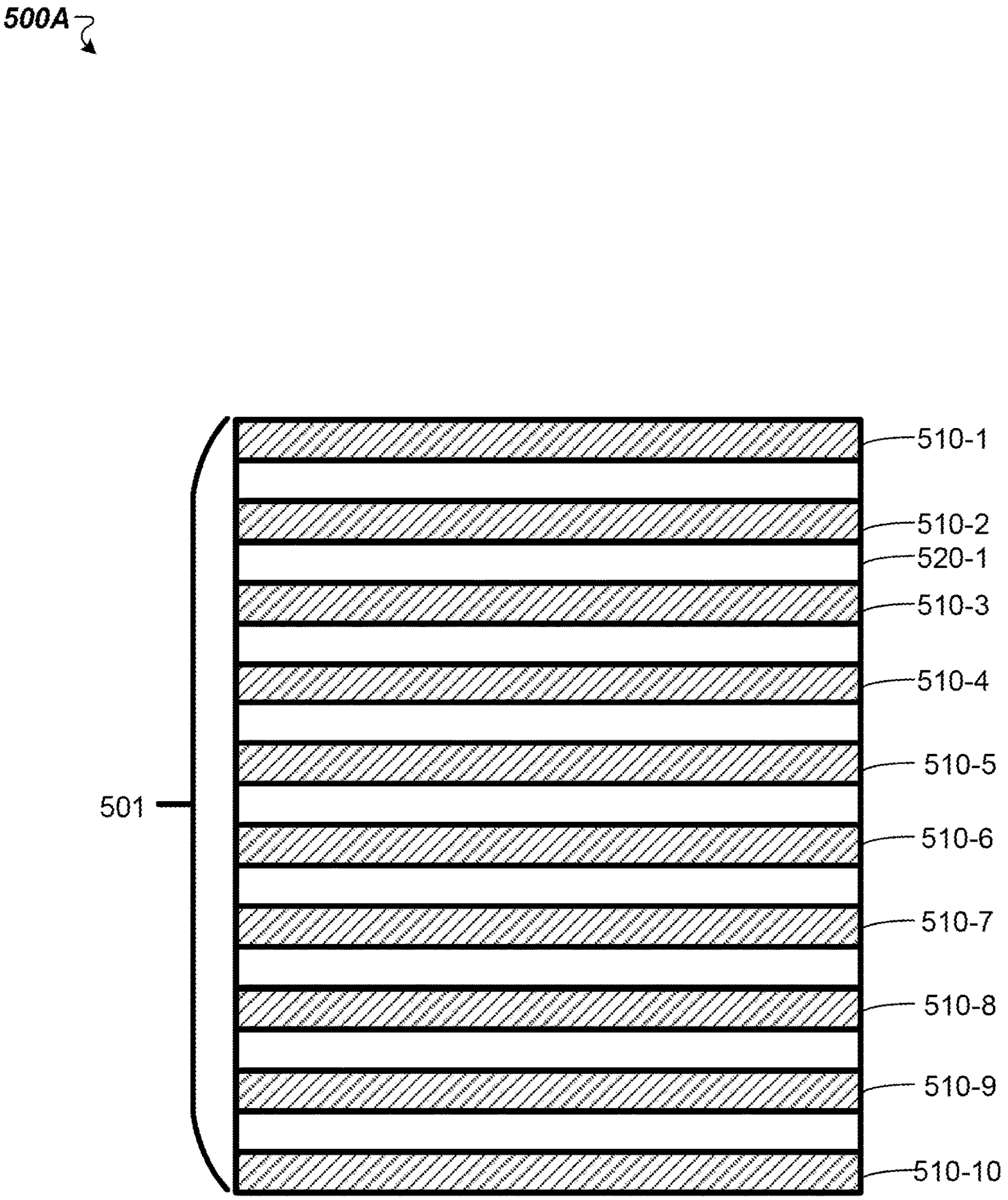
FIGS. 5A-5D are diagrams illustrating the fabrication of an example electronic device including a printed circuit board (PCB), in accordance with at least some embodiments.
Figure 5B:
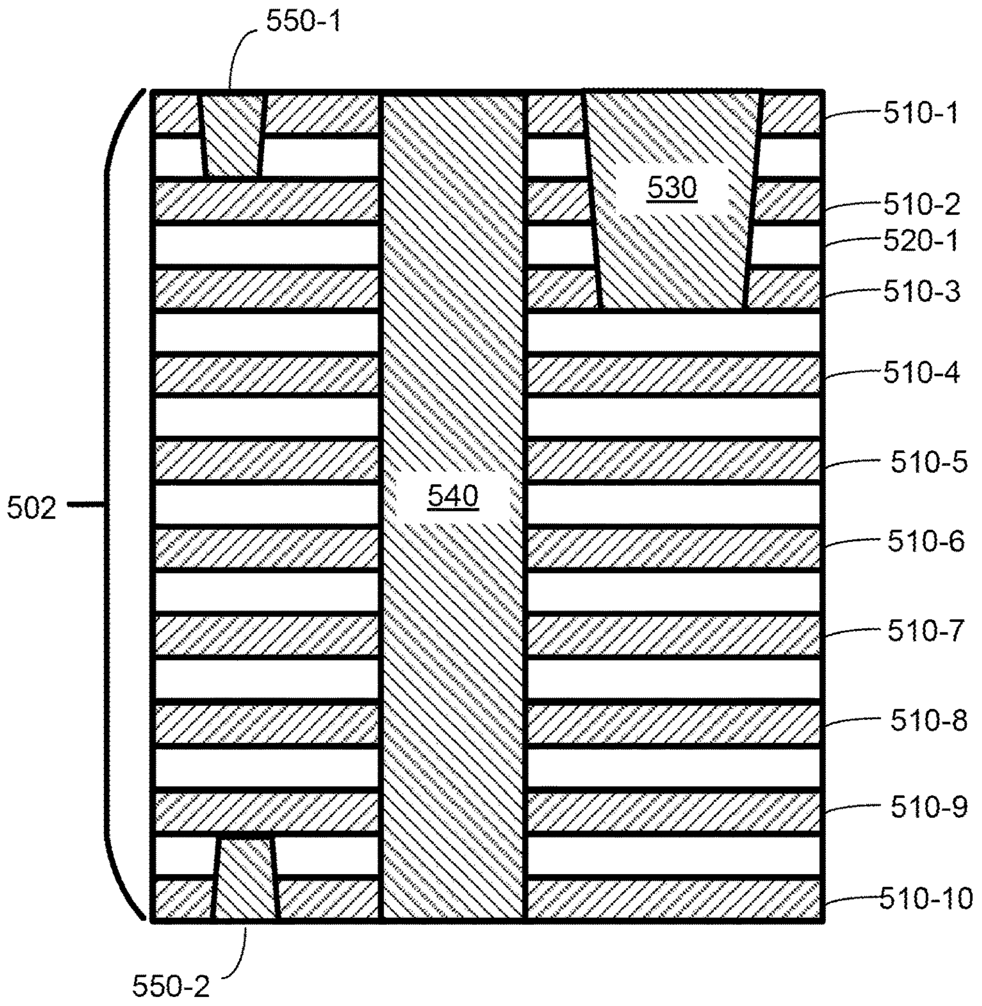

Forming the interior section of the PCB can include forming a set of vias within the set of layers, examples of which are shown in FIGS. 4B and 5B. The set of vias of the interior section of the PCB can include at least one buried skip via. In some embodiments, the at least one buried skip via includes a first buried skip via extending from the first conductive layer of the set of layers to a third conductive layer of the set of layers. The third conductive layer of the set of layers is disposed between the first conductive layer of the set of layers and the second conductive layer of the set of layers. In some embodiments, the first buried skip via bypasses a single conductive layer. For example, the first conductive layer of the set of layers can have an index value of 1, the second conductive layer of the set of layers can have an index value of N, and the third conductive layer of the set of layers can have an index value of 2.

In some embodiments, the at least one buried skip via includes a second buried skip via extending from the second conductive layer of the first set of layers to a fourth conductive layer of the set of layers. The fourth conductive layer of the first set of layers is disposed between the first conductive layer of the set of layers and the second conductive layer of the set of layers. The fourth conductive layer of the set of layers can be any suitable conductive layer within the set of layers. In some embodiments, the second buried skip via bypasses a single conductive layer of the set of layers. For example, the first conductive layer of the set of layers can have an index value of 1, the second conductive layer of the set of layers can have an index value of N, and the fourth conductive layer of the set of layers can have an index value of N−1.

In some embodiments, the set of vias of the interior section of the PCB further includes an additional buried via extending from the first conductive layer of the set of layers to the second conductive layer of the set of layers. For example, the additional buried via can be a BB via. As another example, the additional buried via can be a PTH via.

In some embodiments, the set of vias of the interior section of the PCB further includes at least one additional via. For example, the at least one additional via can include a first additional via extending from the first conductive layer of the set of layers to a conductive layer adjacent to the first conductive layer of the set of layers. More specifically, if the first conductive layer of the set of layers has an index value of 1, then the first additional via can have an index value of 2. As another example, the at least one additional via can include a second additional via extending from the second conductive layer of the set of layers to a conductive layer adjacent to the second conductive layer of the set of layers. More specifically, if the second conductive layer of the set of layers has an index value of N, then the second additional via can have an index value of N−1. In some embodiments, the at least one additional via includes at least one microvia.

In some embodiments, obtaining the interior section includes forming the interior section. Further details regarding operations 110B and 120B are described above with reference to FIGS. 1A-2 and will be described in further detail with reference to FIGS. 4A-4B and 5A-5B.

At operation 130B, at least one set of layers including a non-conductive layer and a conductive layer is formed on at least one end of the interior section and, at operation 140B, at least one portion of at least one exterior section of the PCB is formed from the at least one set of layers. In some embodiments, each set of layers includes a single non-conductive layer and a single conductive layer. Forming the at least one portion of the at least one exterior section of the PCB can include forming at least one via within the at least one set of layers. For example, the at least one via can extend from at least one outermost layer of the at least one set of layers to the at least one end of the interior section of the PCB. For example, the at least one via can include at least one via formed in contact with at least one via of the interior section of the PCB. In some embodiments, the at least one via of the at least one portion of the at least one exterior section of the PCB is stacked on the at least one via of the interior section of the PCB. In some embodiments, the at least via of the at least one portion of the at least one exterior section of the PCB is staggered with respect to the at least one via of the interior section of the PCB. In some embodiments, the at least one via of the at least one exterior section of the PCB includes a microvia formed in contact with at least one microvia of the interior section of the PCB. In embodiments, the set of layers may be formed, and then one or more vias may thereafter be formed in the set of layers. In some embodiments, the at least one portions of the at least one exterior section of the PCB includes a first exterior portion of a first exterior section formed on a first end of the interior section of the PCB, and a second exterior portion of a second exterior section formed on a second end of the interior section of the PCB opposite the first end. Further details regarding operation 130B are described above with reference to FIGS. 1A-2 and will be described in further detail with reference to FIGS. 4A-4B and 5A-5B.

Each conductive layer can include any suitable electrically conductive material (e.g., metal). Examples of materials that can be used to form each conductive layer include Cu, W, Co, Mo, Ru, etc. Non-conductive layers may be formed from a non-conductive (e.g., electrically insulating) material. Examples of non-conductive materials that may be used for the non-conductive layers include a composite plasticized phenol resin and paper material (e.g., FR-2), a composite material of woven fiberglass (e.g., FR-4), plastics, flexible plastics (e.g., for flexible circuit boards), and so on.

At operation 150B, it is determined whether at least one additional portion of the at least one exterior section of the PCB is to be formed. If so, then the process can revert back to operation 130B to form at least one additional set of layers on the at least one end of the interior section (i.e., directly on the at least one previously formed portion of the exterior section). Otherwise, if it is determined that at least one additional portion of the at least one exterior section of the PCB is not to be formed, this means that the at least one exterior section of the PCB is finished. In some embodiments, the at least one exterior section of the PCB determined to be finished at operation 150B includes the first exterior section of the PCB and the second exterior section of the PCB.

The at least one via included in each portion of the exterior section can form a second set of vias. The second set of vias can extend from the first conductive layer of the third set of layers (e.g., an outermost conductive layer of the PCB) to the second conductive layer of the third set of layers. In some embodiments, each via of the second set of vias is a microvia. In some embodiments, the second set of vias includes a set of stacked vias. For example, the second set of vias can be formed on the second additional via. In some embodiments, the second set of vias includes a set of staggered vias. The exterior section of the PCB can have any suitable number of layers. In some embodiments, the exterior section of the PCB includes 3 conductive layers. An illustrative example of these embodiments will be described in further detail below with reference to FIGS. 4A-4F. In some embodiments, the exterior section of the PCB includes 5 conductive layers. An illustrative example of these embodiments will be described in further detail below with reference to FIGS. 5A-5E. Additional electronic device processing may be performed after forming the at least one exterior section. For example, fabricating an electronic device can further include electrically coupling one or more electric components to the PCB.

FIGS. 4A-4F are diagrams illustrating the fabrication of an example electronic device including a PCB, in accordance with at least some embodiments. FIG. 4A shows step 400A of obtaining set of layers 401. Set of layers 401 can include alternating conductive layers and non-conductive layers. More specifically, each non-conductive layer may be disposed between a respective pair of conductive layers. For example, as shown, set of layers 401 can include conductive layers 410-1 through 410-12 and non-conductive layers including non-conductive layer 420-1. In some embodiments, set of layers 401 corresponds to a set of core layers of the PCB. Accordingly, in this illustrative example, set of layers 401 includes 12 conductive layers.

Each conductive layer 410-1 through 410-12 can include any suitable electrically conductive material (e.g., metal). Examples of materials that can be used to form each conductive layer 410-1 through 410-12 include copper (Cu), tungsten (W), cobalt (Co), molybdenum (Mo), ruthenium (Ru), etc. Non-conductive layers including non-conductive layer 420-1 may be formed from a non-conductive (e.g., electrically insulating) material. Examples of non-conductive materials that may be used for the non-conductive layers including non-conductive layer 420-1 include a composite plasticized phenol resin and paper material (e.g., FR-2), a composite material of woven fiberglass (e.g., FR-4), plastics, flexible plastics (e.g., for flexible circuit boards), and so on.

FIG. 4B shows step 400B of forming interior section 402 of the PCB from set of layers 401. More specifically, interior section 402 includes a first set of vias. The first set of vias can include buried skip via 430-1 and buried skip via 430-2. As shown, buried skip via 430-1 extends from conductive layer 410-1 (i.e., a first end of interior section 402) to conductive layer 410-3, and buried skip via 430-2 extends from conductive layer 410-12 (i.e., a second end of interior section 402) to conductive layer 410-10. For example, buried skip via 430-1 is formed from a surface of conductive layer 410-1 to a surface of conductive layer 410-3, and buried skip via 430-2 is formed from a surface of conductive layer 410-12 to a surface of conductive layer 410-10. Thus, in this example, buried skip vias 430-1 and 430-2 each skip a single conductive layer of interior section 402.

The first set of vias can further include additional buried via 440. As shown, additional buried via 440 extends from conductive layer 410-1 (i.e., the first end of interior section 402) to conductive layer 410-12 (i.e., the second end of interior section 402). For example, additional buried via 440 is formed from the surface of conductive layer 410-1 to the surface of conductive layer 410-12. In some embodiments, additional buried via 440 is a BB via. In some embodiments, additional buried via 440 is a PTH via.

The first set of vias can further include additional via 450-1 and additional via 450-2. As shown, additional via 450-1 extends from conductive layer 410-1 (i.e., the first end of interior section 402) to conductive layer 410-2, and additional via 450-2 extends from conductive layer 410-12 (i.e., the second end of interior section 402) to conductive layer 410-11. For example, additional via 450-1 is formed from the surface of conductive layer 410-1 to a surface of conductive layer 410-2, and additional via 450-2 is formed from the surface of conductive layer 410-12 to a surface of conductive layer 410-11. In some embodiments, additional vias 450-1 and 450-2 are microvias.

Figure 4C:
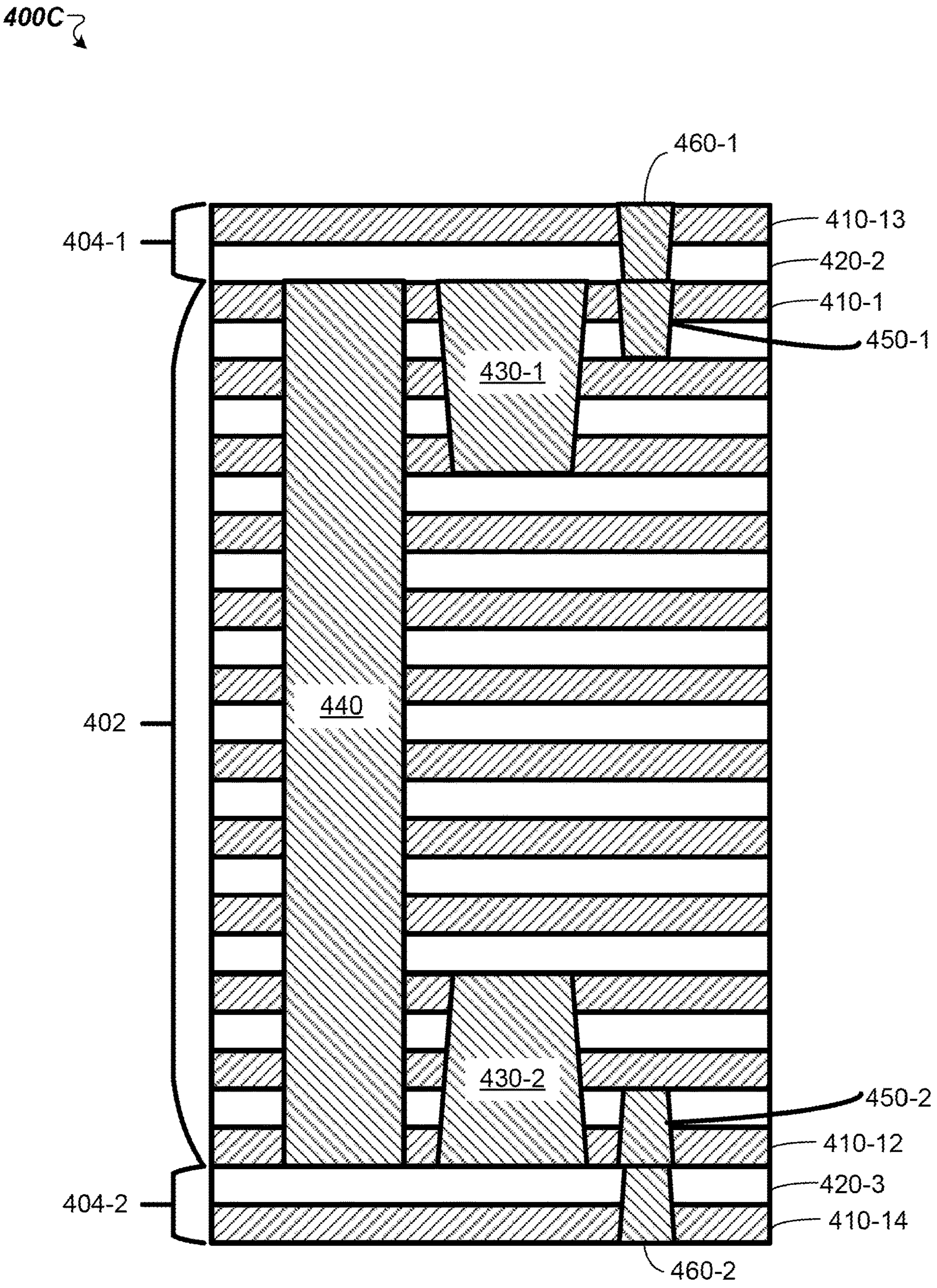

FIG. 4C shows step 400C of forming exterior section portion 404-1 on a first end of interior section 402 and forming exterior section portion 404-2 on a second end of interior section 402 opposite the first end. More specifically, exterior section portion 404-1 is a portion of a first exterior section of the PCB being fabricated, and exterior section portion 404-2 is a portion of a second exterior section of the PCB being fabricated. In some embodiments, exterior section portion 404-1 and exterior section portion 404-2 are symmetrically formed within the same lamination cycle.

As shown, forming exterior section portion 404-1 includes forming, on the first end of interior section 402, non-conductive layer 420-2 and conductive layer 410-13, and forming via 460-1 through layers 410-13 and 420-2 to be in contact with additional via 450-1. Forming exterior section portion 404-2 includes forming, on the second end of interior section 402, non-conductive layer 420-3 and conductive layer 410-14. In this illustrative example, via 460-1 is stacked on additional via 450-1 and via 460-2 is stacked on additional via 450-2. In some embodiments, via 460-1 and via 460-2 are staggered with respect to additional via 450-1 and additional via 450-2, respectively. In some embodiments, via 460-1 and via 460-2 are microvias.

Figure 4D:
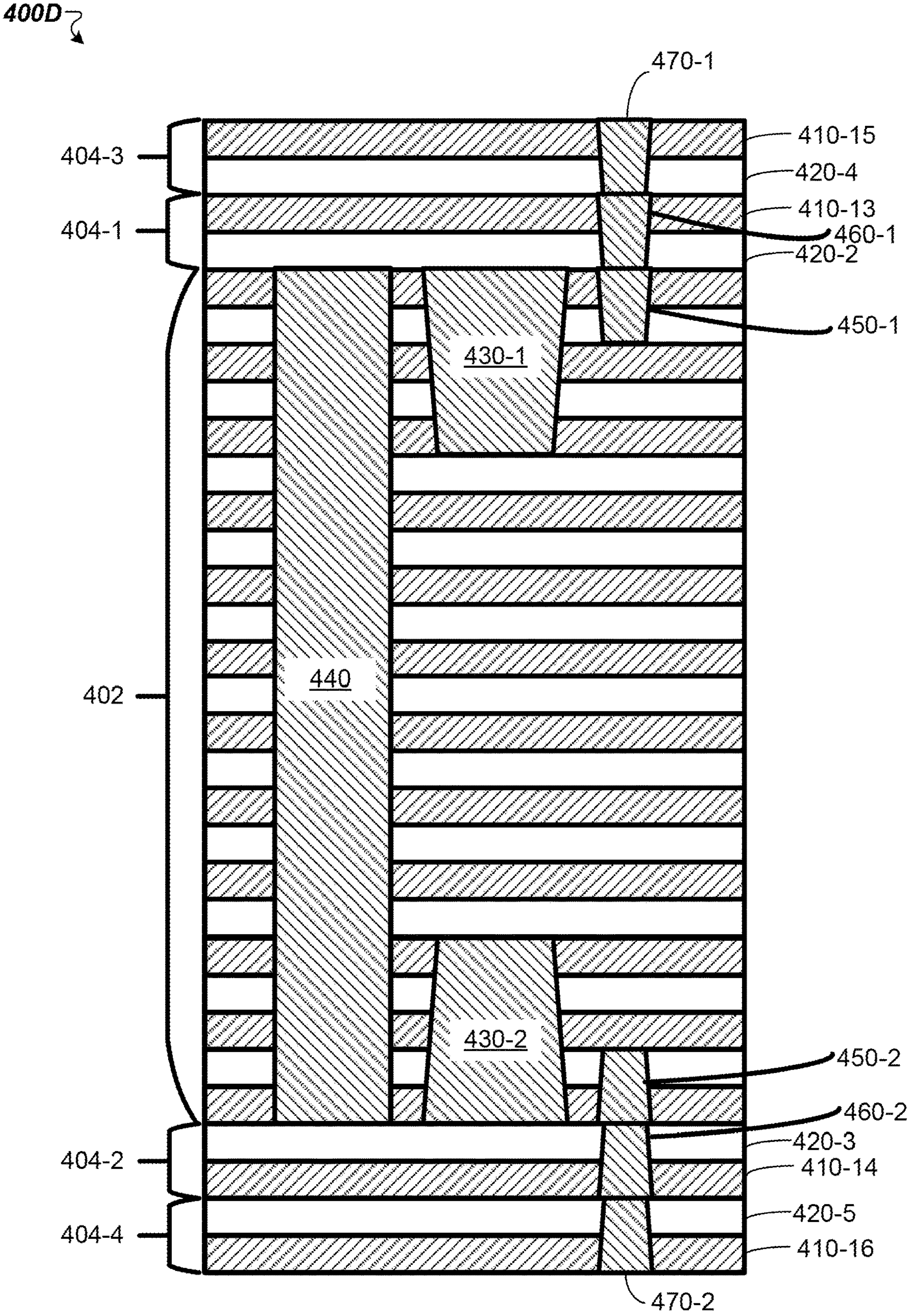

FIG. 4D shows step 400D of forming exterior section portion 404-3 on exterior section portion 404-1 and forming exterior portion 404-4 on exterior section 404-2. More specifically, exterior section portion 404-2 is a second portion of the first exterior section of the PCB being fabricated, and exterior section portion 404-4 is a second portion of the second exterior section of the PCB being fabricated. In some embodiments, exterior section portion 404-3 and exterior section portion 404-4 are symmetrically formed within the same lamination cycle.

As shown, forming exterior section portion 404-3 includes forming, on exterior section portion 404-1, non-conductive layer 420-4 and conductive layer 410-15, and forming via 470-1 through layers 410-15 and 420-4 to be in contact with via 460-1. Forming exterior section portion 404-4 includes forming, on exterior section portion 404-2, non-conductive layer 420-5 and conductive layer 410-16, and forming via 470-2 through layers 410-16 and 420-5 to be in contact with via 460-2. In this illustrative example, via 470-1 is stacked on via 460-1 and via 470-2 is stacked on via 460-2. In some embodiments, via 470-1 and via 470-2 are staggered with respect to via 460-1 and via 460-2, respectively. In some embodiments, via 470-1 and via 470-2 are microvias.

Figure 4E:
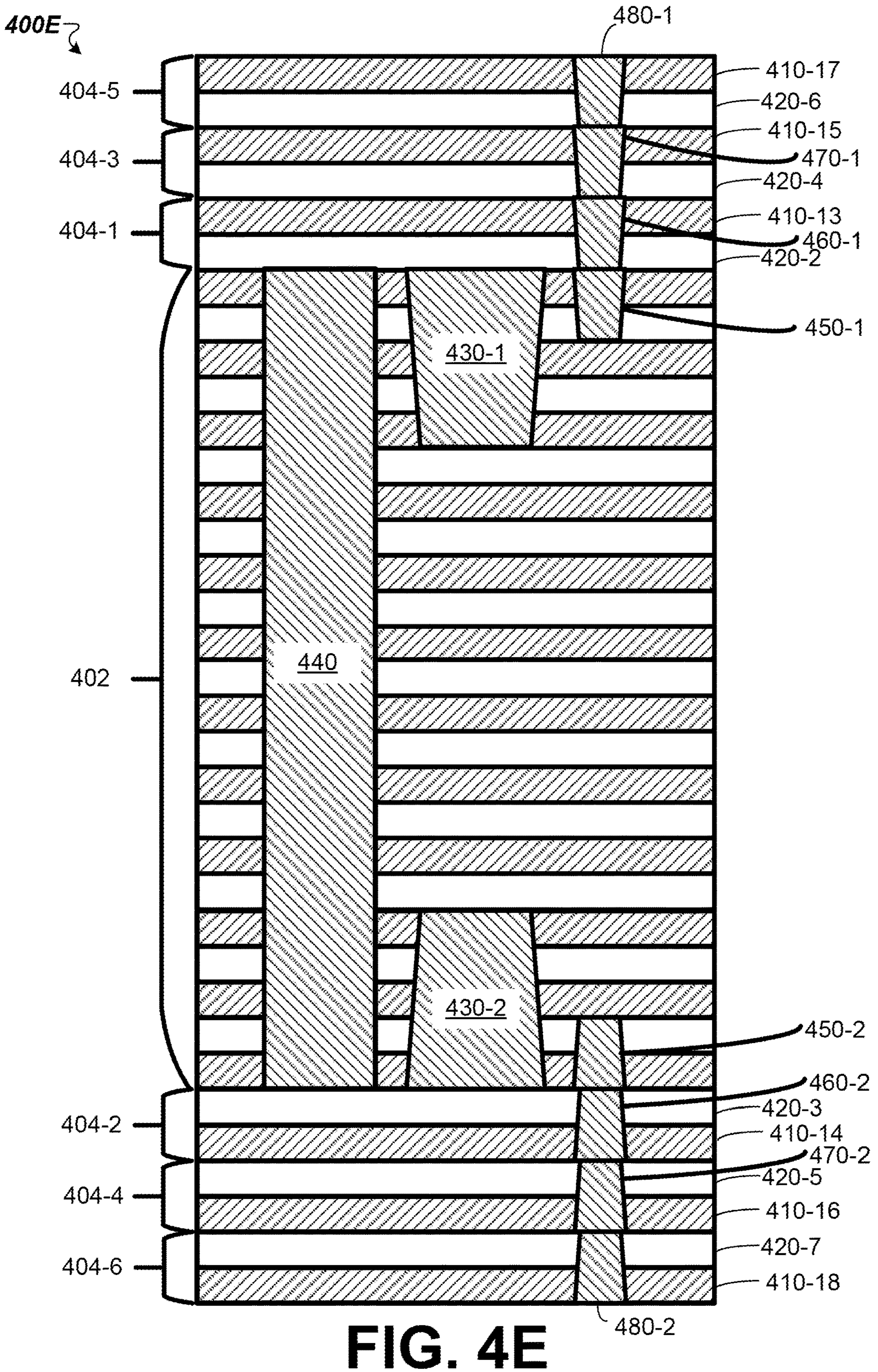

FIG. 4E shows step 400E of forming exterior section portion 404-5 on exterior section portion 404-3 and forming exterior section portion 404-6 on exterior section portion 404-4. More specifically, exterior section portion 404-5 is a third portion of the first exterior section of the PCB being fabricated, and exterior section portion 404-6 is a third portion of the second exterior section of the PCB being fabricated. In some embodiments, exterior section portion 404-5 and exterior section portion 404-6 are symmetrically formed within the same lamination cycle.

As shown, forming exterior section portion 404-5 includes forming, on exterior section portion 404-3, non-conductive layer 420-6 and conductive layer 410-17, and forming via 480-1 through layers 410-17 and 420-6 to be in contact with via 470-1. Forming exterior section portion 404-6 includes forming, on exterior section portion 404-4, non-conductive layer 420-7 and conductive layer 410-18, and forming via 480-2 through layers 410-18 and 420-7 to be in contact with via 470-2. In this illustrative example, via 480-1 is stacked on via 470-1 and via 480-2 is stacked on via 470-2. In some embodiments, via 480-1 and via 480-2 are staggered with respect to via 470-1 and via 470-2, respectively. In some embodiments, via 480-1 and via 480-2 are microvias.

Figure 4F:
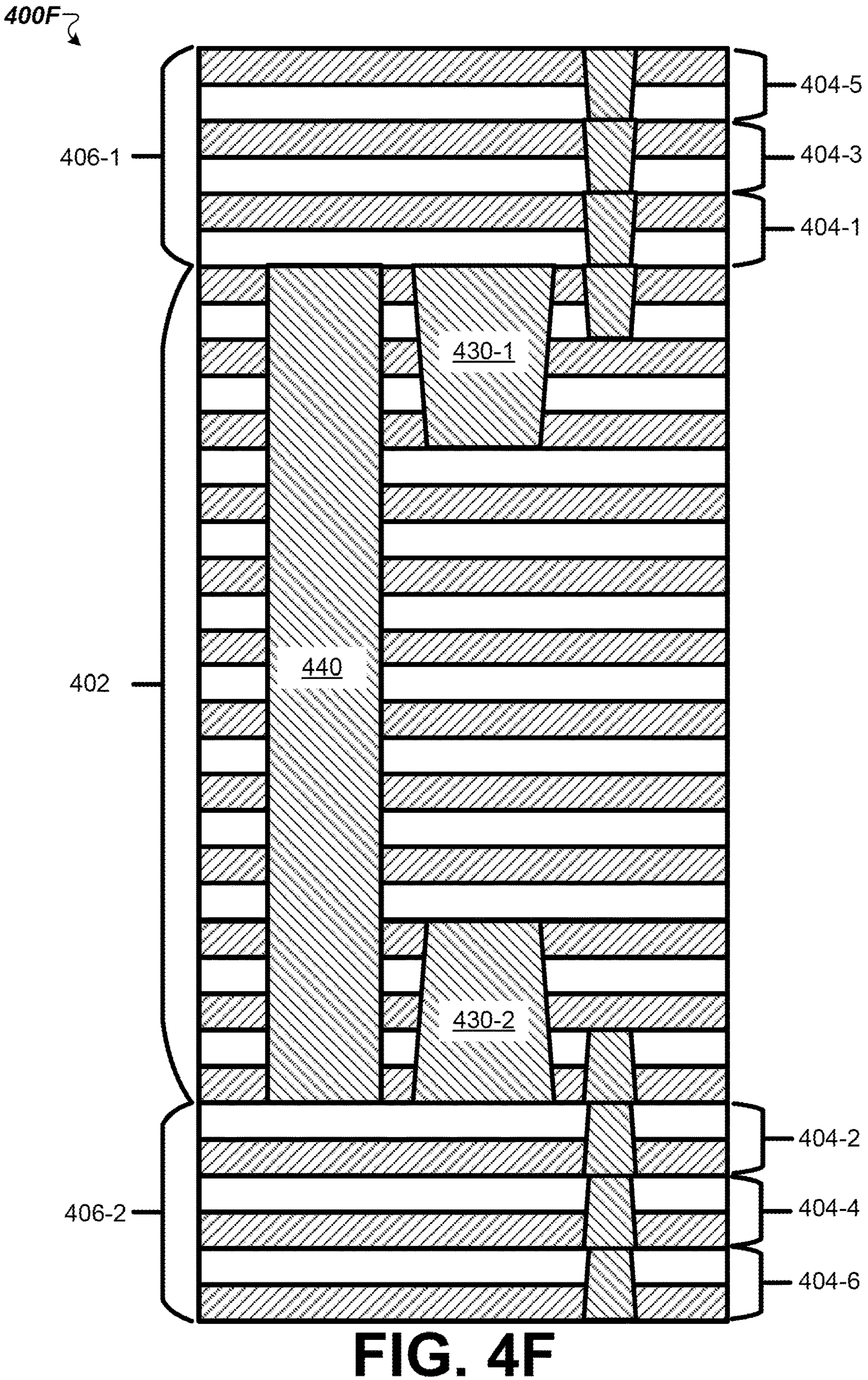

FIG. 4F shows exterior section 406-1 including exterior section portions 404-1, 404-3 and 404-5, and exterior section 406-2 including exterior section portions 404-2, 404-4 and 404-6. In this illustrative example, exterior sections 406-1 and 406-2 each include 3 conductive layers and interior section 402 includes 12 conductive layers. Accordingly, in this illustrative example, the PCB has a 3-12-3 stack design. However, such an example should not be considered limiting. Additional electronic device processing may be performed after forming the at least one exterior section. For example, one or more electrical components (not shown) can be electrically coupled to the PCB.

FIGS. 5A-5D are diagrams illustrating the fabrication of an example electronic device including a PCB, in accordance with at least some embodiments. FIG. 5A shows step 500A of obtaining set of layers 501. Set of layers 501 can include alternating conductive layers and non-conductive layers. More specifically, each non-conductive layer may be disposed between a respective pair of conductive layers. For example, as shown, set of layers 501 can include conductive layers 510-1 through 510-10 and non-conductive layers including non-conductive layer 520-1. In some embodiments, set of layers 501 corresponds to a set of core layers of the PCB. Accordingly, in this illustrative example, set of layers 501 includes 10 conductive layers.

Each conductive layer 510-1 through 510-10 can include any suitable electrically conductive material (e.g., metal). Examples of materials that can be used to form each conductive layer 510-1 through 510-10 include copper (Cu), tungsten (W), cobalt (Co), molybdenum (Mo), ruthenium (Ru), etc. Non-conductive layers including non-conductive layer 420-1 may be formed from a non-conductive (e.g., electrically insulating) material. Examples of non-conductive materials that may be used for the non-conductive layers including non-conductive layer 520-1 include a composite plasticized phenol resin and paper material (e.g., FR-2), a composite material of woven fiberglass (e.g., FR-4), plastics, flexible plastics (e.g., for flexible circuit boards), and so on.

FIG. 5B shows step 500B of forming interior section 502 of the PCB from set of layers 501. More specifically, interior section 502 includes a first set of vias. The first set of vias can include buried skip via 530 extending from conductive layer 510-1 (i.e., a first end of interior section 502) to conductive layer 510-3. For example, buried skip via 530-1 is formed from a surface of conductive layer 510-1 to a surface of conductive layer 510-3. Thus, in this example, buried skip via 530 skips a single conductive layer of interior section 502.

The first set of vias can further include additional buried via 540. As shown, additional buried via 540 extends from conductive layer 510-1 (i.e., the first end of interior section 502) to conductive layer 510-10 (i.e., the second end of interior section 502). For example, additional buried via 540 is formed from the surface of conductive layer 510-1 to the surface of conductive layer 510-10. In some embodiments, additional buried via 540 is a BB via. In some embodiments, additional buried via 540 is a PTH via.

The first set of vias can further include additional via 550-1 and additional via 550-2. As shown, additional via 550-1 extends from conductive layer 510-1 (i.e., the first end of interior section 502) to conductive layer 510-2, and additional via 550-2 extends from conductive layer 510-10 (i.e., the second end of interior section 502) to conductive layer 510-9. For example, additional via 550-1 is formed from the surface of conductive layer 510-1 to a surface of conductive layer 510-2, and additional via 550-2 is formed from the surface of conductive layer 510-10 to a surface of conductive layer 510-9. In some embodiments, additional vias 550-1 and 550-2 are microvias.

Figure 5C:
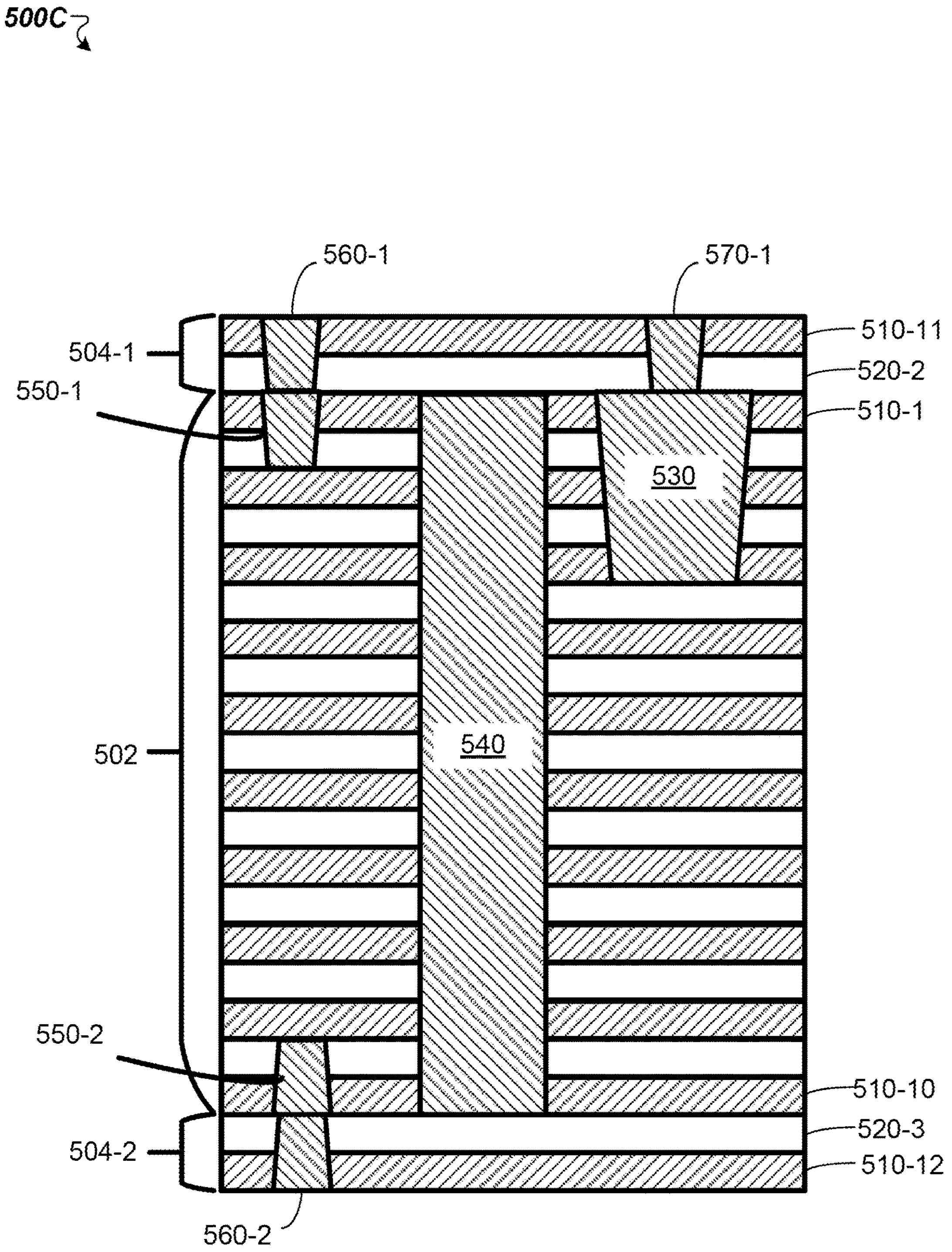

FIG. 5C shows step 500C of forming exterior section portion 504-1 on a first end of interior section 502 and forming exterior section portion 504-2 on a second end of interior section opposite the first end. More specifically, exterior section portion 504-1 is a first portion of a first exterior section of the PCB being fabricated, and exterior section portion 504-2 is a first portion of a second exterior section of the PCB being fabricated. In some embodiments, exterior section portion 504-1 and exterior section portion 504-2 are symmetrically formed within the same lamination cycle.

As shown, forming exterior section portion 504-1 includes forming, on the first end of interior section 502, non-conductive layer 520-2 and conductive layer 510-11, forming via 560-1 through layers 510-11 and 520-2 to be in contact with additional via 550-1, and forming via 570-1 through layers 510-11 and 520-2 to be in contact with buried skip via 530. Forming exterior section portion 504-2 includes forming, on the second end of interior section 502, non-conductive layer 520-3 and conductive layer 510-12, and forming via 560-2 through layers 510-12 and 520-3 to be in contact with additional via 550-2. In this illustrative example, via 560-1 is stacked on additional via 550-1, and via 570-1 is stacked on buried skip via 530 and via 560-2 is stacked on additional via 550-2. In some embodiments, via 560-1 and via 560-2 are staggered with respect to additional via 550-1 and additional via 550-2, respectively. In some embodiments, via 570-1 is staggered with respect to buried skip via 530. In some embodiments, vias 560-1, 560-2 and 570-1 are microvias.

Figure 5D:
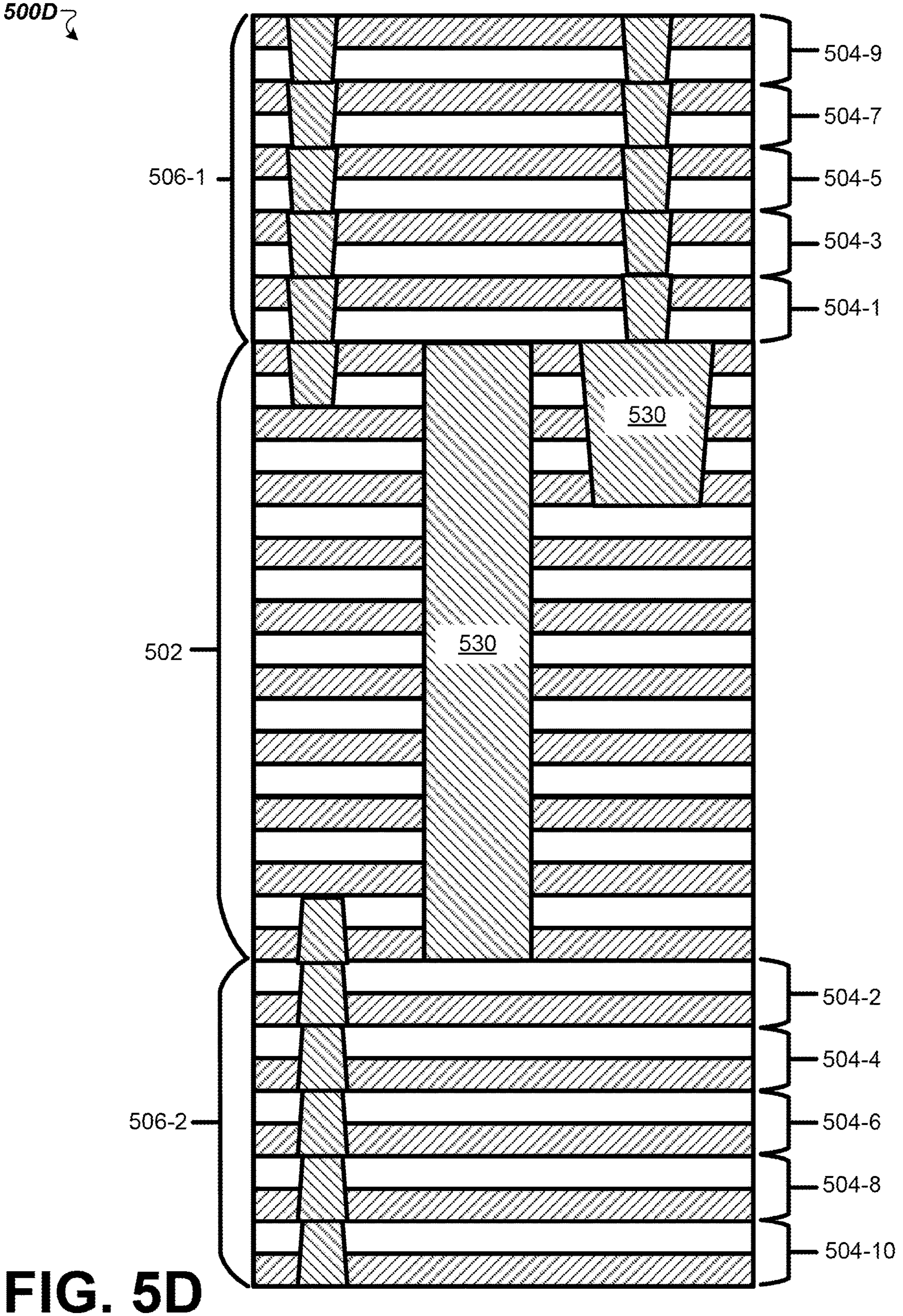

FIG. 5D shows step 500D of forming additional exterior section portions 504-3 through 504-10, resulting in exterior section 506-1 and exterior section 506-2. In some embodiments, exterior section portion 504-3 and exterior section portion 504-4 are symmetrically formed within the same lamination cycle. In some embodiments, exterior section portion 504-5 and exterior section portion 504-6 are symmetrically formed within the same lamination cycle. In some embodiments, exterior section portion 504-7 and exterior section portion 504-8 are symmetrically formed within the same lamination cycle. In some embodiments, exterior section portion 504-9 and exterior section portion 504-10 are symmetrically formed within the same lamination cycle.

As shown, exterior section 504-3 includes a first via formed on via 560-1 and a second via formed on via 570-1 (e.g., stacked) Exterior section 504-5 includes a first via formed on the first via of exterior section 504-3 and a second via formed on the second via of exterior section 504-3 (e.g., stacked). Exterior section 504-7 includes a first via formed on the first via of exterior section 504-5 and a second via formed on the second via of exterior section 504-5 (e.g., stacked). Exterior section 504-9 includes a first via formed on the first via of exterior section 504-7 and a second via formed on the second via of exterior section 504-7 (e.g., stacked). Exterior section 504-4 includes a via formed on via 560-2 (e.g., stacked). Exterior section 504-6 includes a via formed on the via of exterior section 504-4 (e.g., stacked). Exterior section 504-8 includes a via formed on the via of exterior section 504-6 (e.g., stacked). Exterior section 504-10 includes a via formed on the via of exterior section 504-8 (e.g., stacked).

In some embodiments, exterior section 506-1 includes at least one staggered via. In some embodiments, exterior section 506-2 includes at least one staggered via. In some embodiments, the vias of exterior section 506-1 and exterior section 506-2 are microvias. In this illustrative example, exterior sections 506-1 and 506-2 each include 5 conductive layers and interior section 502 includes 10 conductive layers. Accordingly, in this illustrative example, the PCB has a 5-10-5 stack design. However, such an example should not be considered limiting. Additional electronic device processing may be performed after forming the at least one exterior section. For example, one or more electrical components (not shown) can be electrically coupled to the PCB.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A device comprising:

a first exterior section of a printed circuit board (PCB), the first exterior section of the PCB comprising at least three conductive layers including a first outermost conductive layer of the PCB;

a second exterior section of the PCB, the second exterior section of the PCB comprising at least three conductive layers including a second outermost conductive layer of the PCB; and an interior section of the PCB, disposed between the first exterior section of the PCB and the second exterior section of the PCB, comprising a first interior conductive layer corresponding to a first end of the interior section, a second interior conductive layer corresponding to a second end of the interior section opposite the first end, a third interior conductive layer disposed between the first interior conductive layer and the second interior conductive layer, a fourth interior conductive layer disposed between the first interior conductive layer and the second interior conductive layer, a fifth interior conductive layer disposed between the first interior conductive layer and the third interior conductive layer, and a sixth interior conductive layer disposed between the second interior conductive layer and the fourth interior conductive layer;

wherein the first exterior section of the PCB further comprises a first set of vias comprising at least three vertically arranged vias, the first set of vias extending from the first outermost conductive layer to the first interior conductive layer;

wherein the second exterior section of the PCB further comprises a second set of vias comprising at least three vertically arranged vias, the second set of vias extending from the second outermost conductive layer to the second interior conductive layer; and wherein the interior section of the PCB further comprises:

buried skip vias each corresponding to a via having ends connected to respective interior conductive layers of the interior section of the PCB that are separated by at least one layer of the interior section of the PCB, wherein the buried skip vias comprise a first buried skip via extending from the first interior conductive layer to the third interior conductive layer and bypassing the fifth interior conductive layer, and a second buried skip via extending from the second interior conductive layer to the fourth interior conductive layer and bypassing the sixth interior conductive layer;

an additional buried via that spans the interior section by extending from the first interior conductive layer to the second interior conductive layer;

a first additional via directly underneath the first set of vias and having an end connected to the fifth interior conductive layer; and a second additional via directly underneath the second set of vias and having an end connected to the sixth interior conductive layer.

2. The device of claim 1, wherein each via of the first set of vias is a microvia having a depth-to-diameter aspect ratio of less than or equal to about 1:1.

3. The device of claim 1, wherein the first set of vias comprises a set of stacked vias.

4. The device of claim 1, wherein the first set of vias comprises a set of staggered vias.

5. The device of claim 1, wherein the interior section comprises 12 conductive layers.

6. The device of claim 1, wherein a number of conductive layers of each of the first exterior section and the second exterior section is 3, and wherein a number of conductive layers of the interior section is 12.

7. A device comprising:

a first exterior section of a printed circuit board (PCB), the first exterior section of the PCB comprising at least five conductive layers including a first outermost conductive layer of the PCB;

a second exterior section of the PCB, the second exterior section of the PCB comprising at least five conductive layers including a second outermost conductive layer of the PCB; and an interior section of the PCB, disposed between the first exterior section of the PCB and the second exterior section of the PCB, comprising a first interior conductive layer corresponding to a first end of the interior section, a second interior conductive layer corresponding to a second end of the interior section opposite the first end, a third interior conductive layer disposed between the first interior conductive layer and the second interior conductive layer, a fourth interior conductive layer disposed between the first interior conductive layer and the second interior conductive layer, a fifth interior conductive layer disposed between the first interior conductive layer and the third interior conductive layer, and a sixth interior conductive layer disposed between the second interior conductive layer and the fourth interior conductive layer;

wherein the first exterior section of the PCB further comprises a first set of vias and a second set of vias each extending from the first outermost conductive layer to the first interior conductive layer, the first set of vias and the second set of vias each comprising at least five vertically arranged vias;

wherein the second exterior section of the PCB further comprises a third set of vias comprising at least five vertically arranged vias, the third set of vias extending from the second outermost conductive layer to the second interior conductive layer; and wherein the interior section of the PCB further comprises:

a buried skip via having ends connected to respective interior conductive layers of the interior section of the PCB that are separated by at least one layer of the interior section of the PCB, the buried skip via extending from the first interior conductive layer to the third interior conductive layer and bypassing the fifth interior conductive layer, wherein the buried skip via is directly underneath the first set of vias;

an additional buried via that spans the interior section by extending from the first interior conductive layer to the second interior conductive layer;

a first additional via directly underneath the second set of vias and having an end connected to the fifth interior conductive layer; and a second additional via directly underneath the second set of vias and having an end connected to the sixth interior conductive layer.

8. The device of claim 7, wherein each via of the first set of vias is a microvia having a depth-to-diameter aspect ratio of less than or equal to about 1:1.

9. The device of claim 7, wherein the first set of vias comprises a set of stacked vias.

10. The device of claim 7, wherein the first set of vias comprises a set of staggered vias.

11. The device of claim 7, wherein the interior section comprises 10 conductive layers.

12. The device of claim 7, wherein a number of conductive layers of each of the first exterior section and the second exterior section is 5, and wherein a number of conductive layers of the interior section is 10.

* * * * *